United States Patent
Lin et al.

(10) Patent No.: US 7,198,973 B2
(45) Date of Patent: *Apr. 3, 2007

(54) METHOD FOR FABRICATING AN INTERFERENCE DISPLAY UNIT

(75) Inventors: Wen-Jian Lin, Hsinchu (TW); Hsiung-Kuang Tsai, Taipei (TW)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 148 days.

This patent is subject to a terminal disclaimer.

(21) Appl. No.: 10/705,824

(22) Filed: Nov. 13, 2003

(65) Prior Publication Data

US 2004/0209192 A1      Oct. 21, 2004

(30) Foreign Application Priority Data

Apr. 21, 2003      (TW) ............................... 92109264 A

(51) Int. Cl.
*H01L 21/00*      (2006.01)
(52) U.S. Cl. .......................................... 438/48; 438/57
(58) Field of Classification Search ............... 438/48, 438/57, 65; 359/254
See application file for complete search history.

(56) References Cited

U.S. PATENT DOCUMENTS

| | | |
|---|---|---|
| 2,534,846 A | 12/1950 | Ambrose et al. |
| 3,439,973 A | 4/1969 | Paul et al. |
| 3,443,854 A | 5/1969 | Weiss |
| 3,653,741 A | 4/1972 | Marks |
| 3,656,836 A | 4/1972 | de Cremoux et al. |
| 3,725,868 A | 4/1973 | Malmer, Jr. et al. |
| 3,813,265 A | 5/1974 | Marks |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |
| 4,377,324 A | 3/1983 | Durand et al. |
| 4,389,096 A | 6/1983 | Hori et al. |

(Continued)

FOREIGN PATENT DOCUMENTS

CH      681 047      12/1992

(Continued)

OTHER PUBLICATIONS

Akasaka, "Three-Dimensional IC Trends," Proceedings of IEEE, vol. 74, No. 12, pp. 1703–1714, (Dec. 1986).

(Continued)

*Primary Examiner*—Tuan H. Nguyen
(74) *Attorney, Agent, or Firm*—Knobbe, Martens, Olson & Bear, LLP.

(57) ABSTRACT

A method for fabricating an interference display unit is provided. A first plate and a sacrificial layer are formed in order on a substrate and at least two openings are formed in the first plate and the sacrificial layer. A photoresist layer is spin-coated on the sacrificial layer and fills the openings. A photolithographic process patterns the photoresist layer to define a support with an arm. A second plate is formed on the sacrificial layer and posts. The arm's stress is released through a thermal process. The position of the arm is shifted and the distance between the first plate and the second plate is therefore defined. Finally, The sacrificial layer is removed.

20 Claims, 6 Drawing Sheets

U.S. PATENT DOCUMENTS

| | | | |
|---|---|---|---|
| 4,403,248 A | 9/1983 | Te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,681,403 A | 7/1987 | Te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,937,496 A | 6/1990 | Neiger et al. |
| 4,954,789 A | 9/1990 | Sampsell |
| 4,956,619 A | 9/1990 | Hornbeck |
| 4,982,184 A | 1/1991 | Kirkwood |
| 5,018,256 A | 5/1991 | Hornbeck |
| 5,022,745 A | 6/1991 | Zayhowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,331,454 A | 7/1994 | Hornbeck |
| 5,339,116 A | 8/1994 | Urbanus et al. |
| 5,345,328 A | 9/1994 | Fritz et al. |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,489,952 A | 2/1996 | Gove et al. |
| 5,497,172 A | 3/1996 | Doherty et al. |
| 5,497,197 A | 3/1996 | Gove et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoads et al. |
| 5,619,366 A | 4/1997 | Rhoads et al. |
| 5,622,814 A | 4/1997 | Miyata et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,768 A | 7/1997 | Kaeriyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |

| | | | | | | |
|---|---|---|---|---|---|---|
| 5,673,139 | A | 9/1997 | Johnson | 6,632,698 B2 | 10/2003 | Ives |
| 5,674,757 | A | 10/1997 | Kim | 6,635,919 B1 | 10/2003 | Melendez et al. |
| 5,683,591 | A | 11/1997 | Offenberg | 6,643,069 B2 | 11/2003 | Dewald |
| 5,703,710 | A | 12/1997 | Brinkman et al. | 6,650,455 B2 | 11/2003 | Miles |
| 5,706,022 | A | 1/1998 | Hato | 6,657,832 B2 | 12/2003 | Williams et al. |
| 5,710,656 | A | 1/1998 | Goossen | 6,666,561 B1 | 12/2003 | Blakley |
| 5,726,480 | A | 3/1998 | Pister | 6,674,562 B1 * | 1/2004 | Miles ............... 359/291 |
| 5,739,945 | A | 4/1998 | Tayebati | 6,680,792 B2 | 1/2004 | Miles |
| 5,745,193 | A | 4/1998 | Urbanus et al. | 6,710,908 B2 | 3/2004 | Miles et al. |
| 5,745,281 | A | 4/1998 | Yi et al. | 6,720,267 B1 | 4/2004 | Chen et al. |
| 5,771,116 | A | 6/1998 | Miller et al. | 6,736,987 B1 | 5/2004 | Cho |
| 5,784,190 | A | 7/1998 | Worley | 6,741,377 B2 | 5/2004 | Miles |
| 5,784,212 | A | 7/1998 | Hornbeck | 6,741,384 B1 | 5/2004 | Martin et al. |
| 5,793,504 | A | 8/1998 | Stoll | 6,741,503 B1 | 5/2004 | Farris et al. |
| 5,808,780 | A | 9/1998 | McDonald | 6,743,570 B2 | 6/2004 | Harnett et al. |
| 5,818,095 | A | 10/1998 | Sampsell | 6,747,785 B2 | 6/2004 | Chen et al. |
| 5,825,528 | A | 10/1998 | Goossen | 6,747,800 B1 | 6/2004 | Lin |
| 5,835,255 | A | 11/1998 | Miles | 6,756,317 B2 | 6/2004 | Sniegowski et al. |
| 5,842,088 | A | 11/1998 | Thompson | 6,768,097 B1 | 7/2004 | Viktorovitch et al. |
| 5,867,302 | A | 2/1999 | Fleming | 6,775,174 B2 | 8/2004 | Huffman et al. |
| 5,912,758 | A | 6/1999 | Knipe et al. | 6,778,155 B2 | 8/2004 | Doherty et al. |
| 5,943,158 | A | 8/1999 | Ford et al. | 6,778,306 B2 | 8/2004 | Sniegowski et al. |
| 5,959,763 | A | 9/1999 | Bozler et al. | 6,794,119 B2 | 9/2004 | Miles |
| 5,972,193 | A | 10/1999 | Chou et al. | 6,811,267 B1 | 11/2004 | Allen et al. |
| 5,976,902 | A | 11/1999 | Shih | 6,812,482 B2 | 11/2004 | Fleming et al. |
| 5,986,796 | A | 11/1999 | Miles | 6,819,469 B1 | 11/2004 | Koba |
| 6,028,690 | A | 2/2000 | Carter et al. | 6,822,628 B2 | 11/2004 | Dunphy et al. |
| 6,038,056 | A | 3/2000 | Florence et al. | 6,829,132 B2 | 12/2004 | Martin et al. |
| 6,040,937 | A | 3/2000 | Miles | 6,853,129 B1 | 2/2005 | Cummings et al. |
| 6,049,317 | A | 4/2000 | Thompson et al. | 6,855,610 B2 | 2/2005 | Tung et al. |
| 6,055,090 | A | 4/2000 | Miles | 6,859,218 B1 | 2/2005 | Luman et al. |
| 6,061,075 | A | 5/2000 | Nelson et al. | 6,861,277 B1 | 3/2005 | Monroe et al. |
| 6,099,132 | A | 8/2000 | Kaeriyama | 6,862,022 B2 | 3/2005 | Slupe |
| 6,100,872 | A | 8/2000 | Aratani et al. | 6,862,029 B1 | 3/2005 | D'Souza et al. |
| 6,113,239 | A | 9/2000 | Sampsell et al. | 6,867,896 B2 | 3/2005 | Miles |
| 6,115,326 | A | 9/2000 | Puma et al. | 6,870,581 B2 | 3/2005 | Li et al. |
| 6,147,790 | A | 11/2000 | Meier et al. | 6,870,654 B2 | 3/2005 | Lin et al. |
| 6,160,833 | A | 12/2000 | Floyd et al. | 6,882,458 B2 | 4/2005 | Lin et al. |
| 6,180,428 | B1 | 1/2001 | Peeters et al. | 6,882,461 B1 | 4/2005 | Tsai et al. |
| 6,195,196 | B1 | 2/2001 | Kimura et al. | 6,912,022 B2 | 6/2005 | Lin et al. |
| 6,201,633 | B1 | 3/2001 | Peeters et al. | 6,952,303 B2 | 10/2005 | Lin et al. |
| 6,232,936 | B1 | 5/2001 | Gove et al. | 6,958,847 B2 | 10/2005 | Lin |
| 6,243,149 | B1 | 6/2001 | Swanson et al. | 2001/0003487 A1 | 6/2001 | Miles |
| 6,282,010 | B1 | 8/2001 | Sulzbach et al. | 2001/0026951 A1 | 10/2001 | Vergani et al. |
| 6,284,560 | B1 | 9/2001 | Jech, Jr. et al. | 2001/0040649 A1 | 11/2001 | Ozaki |
| 6,295,154 | B1 | 9/2001 | Laor et al. | 2001/0040675 A1 | 11/2001 | True et al. |
| 6,323,982 | B1 | 11/2001 | Hornbeck | 2002/0001521 A1 | 1/2002 | Miles |
| 6,351,329 | B1 | 2/2002 | Greywall | 2002/0013821 A1 | 1/2002 | Jin et al. |
| 6,356,254 | B1 | 3/2002 | Kimura | 2002/0015215 A1 | 2/2002 | Miles |
| 6,376,787 | B1 | 4/2002 | Martin et al. | 2002/0036304 A1 | 3/2002 | Ehmke et al. |
| 6,392,233 | B1 | 5/2002 | Channin et al. | 2002/0054424 A1 | 5/2002 | Miles |
| 6,407,851 | B1 | 6/2002 | Islam et al. | 2002/0055253 A1 | 5/2002 | Rudhard |
| 6,447,126 | B1 | 9/2002 | Hornbeck | 2002/0071169 A1 | 6/2002 | Bowers et al. |
| 6,452,465 | B1 | 9/2002 | Brown et al. | 2002/0075555 A1 | 6/2002 | Miles |
| 6,456,420 | B1 | 9/2002 | Goodwin-Johansson | 2002/0126364 A1 | 9/2002 | Miles |
| 6,465,355 | B1 | 10/2002 | Horsley | 2002/0135857 A1 | 9/2002 | Fitzpatrick et al. |
| 6,466,354 | B1 | 10/2002 | Gudeman | 2002/0137072 A1 | 9/2002 | Mirkin et al. |
| 6,466,358 | B2 | 10/2002 | Tew | 2002/0168136 A1 | 11/2002 | Atia et al. |
| 6,473,274 | B1 | 10/2002 | Maimone et al. | 2003/0006468 A1 | 1/2003 | Ma et al. |
| 6,480,177 | B2 | 11/2002 | Doherty et al. | 2003/0043157 A1 | 3/2003 | Miles |
| 6,496,122 | B2 | 12/2002 | Sampsell | 2003/0062186 A1 | 4/2003 | Boroson et al. |
| 6,513,911 | B1 | 2/2003 | Ozaki et al. | 2003/0072070 A1 | 4/2003 | Miles |
| 6,545,335 | B1 | 4/2003 | Chua et al. | 2003/0090350 A1 | 5/2003 | Feng et al. |
| 6,548,908 | B2 | 4/2003 | Chua et al. | 2003/0112096 A1 | 6/2003 | Potter |
| 6,549,338 | B1 | 4/2003 | Wolverton et al. | 2003/0152872 A1 | 8/2003 | Miles |
| 6,552,840 | B2 | 4/2003 | Knipe | 2003/0202264 A1 | 10/2003 | Weber et al. |
| 6,574,033 | B1 | 6/2003 | Chui et al. | 2003/0202265 A1 | 10/2003 | Reboa et al. |
| 6,589,625 | B1 | 7/2003 | Kothari et al. | 2003/0202266 A1 | 10/2003 | Ring et al. |
| 6,600,201 | B2 | 7/2003 | Hartwell et al. | 2004/0010115 A1 | 1/2004 | Sotzing |
| 6,606,175 | B1 | 8/2003 | Sampsell et al. | 2004/0027636 A1 | 2/2004 | Miles |
| 6,608,268 | B1 | 8/2003 | Goldsmith | 2004/0027701 A1 | 2/2004 | Ishikawa |
| 6,625,047 | B2 | 9/2003 | Coleman, Jr., deceased | 2004/0028849 A1 | 2/2004 | Stark et al. |
| 6,630,786 | B2 | 10/2003 | Cummings et al. | 2004/0035821 A1 | 2/2004 | Doan et al. |

| | | | |
|---|---|---|---|
| 2004/0051929 A1* | 3/2004 | Sampsell et al. ........... 359/247 |
| 2004/0053434 A1 | 3/2004 | Bruner |
| 2004/0058532 A1 | 3/2004 | Miles et al. |
| 2004/0061543 A1 | 4/2004 | Nam et al. |
| 2004/0063322 A1 | 4/2004 | Yang |
| 2004/0080807 A1 | 4/2004 | Chen et al. |
| 2004/0080832 A1 | 4/2004 | Singh Mandeep |
| 2004/0100677 A1 | 5/2004 | Huibers et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0136076 A1 | 7/2004 | Tayebati Parviz |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0150869 A1 | 8/2004 | Kasai |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0191937 A1 | 9/2004 | Patel et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Piehl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0020089 A1 | 1/2005 | Shi et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0168849 A1 | 8/2005 | Lin |
| 2005/0195462 A1 | 9/2005 | Lin |
| 2005/0202649 A1 | 9/2005 | Hung et al. |

FOREIGN PATENT DOCUMENTS

| | | |
|---|---|---|
| DE | 10228946 A1 | 1/2004 |
| EP | 0 667 548 A1 | 8/1995 |
| EP | 0 694 801 | 1/1996 |
| EP | 0 695 959 | 2/1996 |
| EP | 0 878 824 A2 | 11/1998 |
| EP | 1 197 778 | 4/2002 |
| EP | 1 452 481 A | 9/2004 |
| JP | 04-211216 | 8/1992 |
| JP | 05275401 A1 | 10/1993 |
| JP | 2002 062493 | 2/2002 |
| JP | 2002-062505 | 2/2002 |
| JP | 2002-174780 | 6/2002 |
| JP | 2003001598 A | 1/2003 |
| JP | 2004106074 A | 4/2004 |
| JP | 2005051007 A | 2/2005 |
| WO | WO9530924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 02/24570 | 3/2002 |
| WO | WO03007049 A1 | 1/2003 |
| WO | WO 03052506 | 6/2003 |
| WO | WO 03/069413 A | 8/2003 |
| WO | WO03069413 A1 | 8/2003 |
| WO | WO03073151 A1 | 9/2003 |
| WO | WO04006003 A1 | 1/2004 |
| WO | WO04026757 A2 | 4/2004 |
| WO | WO 2005/019899 A1 | 3/2005 |

OTHER PUBLICATIONS

Austrian Search Report dated May 4, 2005.
Austrian Search Report dated Aug. 12, 2005.
Aratani K. et al., "Process and Design Considerations for Survace Micromachined Beams for a Tuneable Interferometer Array in Silicon," Proceedings of the Workshop on Micro Electro Mechanical Systems (MEMS) Fort Lauderale, Feb. 7-10, 1993, New York, IEEE, US, vol. Workshop 6, Feb. 7, 1993, pp. 230-235.
Aratani et al., "Surface micromachined tuneable interferometer array," Sensors and Actuators, pp. 17-23. (1994).
Conner, "Hybrid Color Display Using Optical Interference array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography, " Electronics pp. 78-80 (Feb. 5, 1987).
Harnett et al., "Heat-depolymerizable polycarbonates as electron beam patternable sacrificial layers for nanofluidics, " J. Vac. Sci. Technol. B 19(6), (Nov. /Dec. 2001), pp. 2842-2845.
Howard et al., "Nanometer-Scale Fabrication Techniques, " VLSI Electronics: Microstructure Science, vol. 5, pp. 145-153 and pp. 166-173 (1982).
Ibbotson et al., "Comparison of XeF2 and F-atom reactions with Si and SiO2, " Applied Physics Letters, vol. 44, No. 12, pp. 1129-1131 (Jun. 1984).
Jackson "Classical Electrodynamics," John Wiley & Sons Inc., pp. 568-573. (date unknown).
Jerman et al., "A Miniature Fabry-Perot Interferometer with a Corrugated Silicon Diaphragm Support, " (1988).
Joannopoulos et al., "Photonic Crystals: Molding the Flow of Light," Princeton University Press (1995).
Johnson, "Optical Scanners," Microwave Scanning Antennas, vol. 1, pp. 251-261, (1964).
Kim et al., "Control of Optical Transmission Through Metals Perforated with Subwavelength Hole Arrays," Optic Letters vol. 24, No. 4, pp. 256-257, (Feb. 1999).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Lee et al., "Electrostatic Actuation of Surface/Bulk Micromachined Singlecrystal Silicon Microresonators", International Conference on Intelligent Robots and Systems, vol. 2, pp. 1057-1062, (Oct. 17-21, 1999).

Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).

Light over Matter, Circle No. 36 (Jun. 1993).

Lin et al. "Free-Space Micromachined Optical Switches for Optical Networking," IEEE Journal of Selected Topics in Quantum Electronics, vol. 5, No. 1, pp. 4-9. (Jan./Feb. 1999).

Little et al., "Vertically Coupled Microring Resonator Channel Dropping Filter," IEEE Photonics Technology Letters, vol. 11, No. 2, (1999).

Magel, "Integrated Optic Devices Using Micromachined Metal Membranes," SPIE vol. 2686, 08194-2060-Mar. (1996).

Miles, Mark, W., "A New Reflective FPD Technology Using Interferometric Modulation," The Proceedings of the Society for Information Display (May 11-16, 1997).

Nagami et al., "Plastic Cell Architecture: Towards Reconfiguraable Computing for General Purpose," IEEE, 0-8186-8900, pp. 68-77, (May 1998).

Newsbreaks, "Quantum-trench devices might operate at terahertz frequencies," Laser Focus World (May 1993).

Oliner et al., "Radiating Elements and Mutual Coupling," Microwave Scanning Antennas, vol. 2 pp. 131-141, (1966).

PCT/US02/13442, Search Report Sep. 13, 2002.

PCT/US04/20330 Search Report Nov. 8, 2004.

PCT/US05/029821 International Search Report (Dec. 27, 2005).

PCT/US05/030927 International Search Report (Jan. 25, 2006).

PCT/US05/031693 International Search Report.

PCT/US05/032231 International Search Report (Apr. 7, 2006).

PCT/US05/033558 Partial International Search Report (Feb. 24, 2006).

PCT/US2004/035820 International Seach Report and Written Opinion (Apr. 11, 2005).

PCT/US96/17731 Search Report.

Raley et al., "A Fabry-Perot Microinterferometer for Visible Wavelengths," IEEE Sold-State Sensor and Actuator Workshop, Jun. 1992, Hilton Head, SC.

Schnakenberg et al., "TMAHW Etchants for Silicon Micromachining," 1991 International Conference on Solid State Sensors and Actuators-Digest of Technical Papers, pp. 815-818 (1991).

Sperger et al., "High Performance Patterned All-Dielectric Interference Colour Filter for Display Applications," SID Digest, pp. 81-83, (1994).

Sridharan et al. "Post-Packaging Release A New Concept for Surface-Micromachined Devices" Technical Digest, IEEE Solid-State Sensor & Actuator Workshop, New York, NY, US, Nov. 8, 1998, pp.225-228, XP000992464.

Stone, "Radiation and Optics, An Introduction to the Classical Theory," McGraw-Hill, pp. 340-343, (1963).

Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors," ASIA Display '95, pp. 929-931, (Oct. 1995).

Zhou et al., "Waveguide Panel Display Using Electromechanical Spatial Modulators" SID Digest, vol. XXIX, (1998).

* cited by examiner

METHOD FOR FABRICATING AN INTERFERENCE DISPLAY UNIT

FIELD OF INVENTION

The present invention relates to a method for manufacturing an optical interference display. More particularly, the present invention relates to a method for manufacturing an optical interference display with posts of arms.

BACKGROUND OF THE INVENTION

Planar displays are popular for portable displays and displays with space limits because they are light and small in size. To date, planar displays in addition to liquid crystal displays (LCD), organic electro-luminescent displays (OLED), plasma display panels (PDP) and so on, as well as a mode of the optical interference display are of interest.

U.S. Pat. No. 5,835,255 discloses an array of display units of visible light that can be used in a planar display. Please refer to FIG. 1, which depicts a cross-sectional view of a display unit in the prior art. Every optical interference display unit 100 comprises two walls, 102 and 104. Posts 106 support these two walls 102 and 104, and a cavity 108 is subsequently formed. The distance between these two walls 102 and 104, that is, the length of the cavity 108, is D. One of the walls 102 and 104 is a semi-transmissible/semi-reflective layer with an absorption rate that partially absorbs visible light, and the other is a light reflective layer that is deformable when voltage is applied. When the incident light passes through the wall 102 or 104 and arrives in the cavity 108, in all visible light spectra, only the visible light with the wavelength corresponding to the formula 1.1 can generate a constructive interference and can be emitted, that is, $$2D=N\lambda \quad (1.1)$$

where N is a natural number.

When the length D of cavity 108 is equal to half of the wavelength times any natural number, a constructive interference is generated and a sharp light wave is emitted. In the meantime, if the observer follows the direction of the incident light, a reflected light with wavelength $\lambda_1$ can be observed. Therefore, the display unit 100 is "open".

The first wall 102 is a semi-transmissible/semi-reflective electrode that comprises a substrate, an absorption layer, and a dielectric layer. Incident light passing through the first wall 102 is partially absorbed by the absorption layer. The substrate is made from conductive and transparent materials, such as ITO glass or IZO glass. The absorption layer is made from metal, such as aluminum, chromium or silver and so on. The dielectric layer is made from silicon oxide, silicon nitrite or metal oxide. Metal oxide can be obtained by directly oxidizing a portion of the absorption layer. The second wall 104 is a deformable reflective electrode. It shifts up and down by applying a voltage. The second wall 104 is typically made from dielectric materials/conductive transparent materials, or metal/conductive transparent materials.

FIG. 2 depicts a cross-sectional view of a display unit in the prior art after applying a voltage. As shown in FIG. 2, while driven by the voltage, the wall 104 is deformed and falls down towards the wall 102 due to the attraction of static electricity. At this time, the distance between wall 102 and 104, that is, the length of the cavity 108 is not exactly zero, but is d, which can be zero. If we use d instead of D in formula 1.1, only the visible light with a wavelength satisfying formula 1.1, which is $\lambda_2$, can generate a constructive interference, and be reflected by the wall 104, and pass through the wall 102. Because wall 102 has a high light absorption rate for light with wavelength $\lambda_2$, all the incident light in the visible light spectrum is filtered out and an observer who follows the direction of the incident light cannot observe any reflected light in the visible light spectrum. The display unit 100 is now "closed".

Refer to FIG. 1 again, which shows that the posts 106 of the display unit 100 are generally made from negative photoresist materials. Refer to FIGS. 3A to 3C, which depict a method for manufacturing a display unit in the prior art. Referring to FIG. 3A, the first wall 102 and a sacrificial layer 110 are formed in order on a transparent substrate 109, and then an opening 112 is formed in the wall 102 and the sacrificial layer 110. The opening 112 is suitable for forming posts therein. Next, a negative photoresist layer 111 is spin-coated on the sacrificial layer 110 and fills the opening 112. The objective of forming the negative photoresist layer 111 is to form posts between the first wall 102 and the second wall (not shown). A backside exposure process is performed on the negative photoresist layer 111 in the opening 112, in the direction indicated by arrow 113 to the transparent substrate 109. The sacrificial layer 110 must be made from opaque materials, typically metal materials, to meet the needs of the backside exposure process.

Refer to FIG. 3B, which shows that posts 106 remain in the opening 112 after removing the unexposed negative photoresist layer. Then, the wall 104 is formed on the sacrificial layer 110 and posts 106. Referring to FIG. 3C, the sacrificial layer 110 is removed by a release etch process to form a cavity 114. The length D of the cavity 114 is the thickness of the sacrificial layer 110. Therefore, different thicknesses of the sacrificial layers must be used in different processes of the different display units to control reflection of light with different wavelengths.

An array comprising the display unit 100 controlled by voltage operation is sufficient for a single color planar display, but not for a color planar display. A method in the prior art is to manufacture a pixel that comprises three display units with different cavity lengths as shown in FIG. 4, which depicts a cross-sectional view of a matrix color planar display in the prior art. Three display units 302, 304 and 306 are formed as an array on a substrate 300, respectively. Display units 302, 304 and 306 can reflect an incident light 308 to color lights with different wavelengths, for example, which are red, green and blue lights, due to the different lengths of the cavities of the display units 302, 304 and 306. It is not required that different reflective mirrors be used for the display units arranged in the array. More important is that good resolution be provided and the brightness of all color lights is uniform. However, three display units with different lengths of cavities need to be manufactured separately.

Please refer to FIGS. 5A to 5D, which depict cross-sectional views of a method for manufacturing the matrix color planar display in the prior art. In FIG. 5A, the first wall 310 and the first sacrificial layer 312 are formed in order on a transparent substrate 300, and then openings 314, 316, 318, and 320 are formed in the first wall 310 and the sacrificial layer 312 for defining predetermined positions where display units 302, 304, and 306 are formed. The second sacrificial layer 322 is then conformally formed on the first sacrificial layer 312 and in the openings 314, 316, 318, and 320.

Please referring to FIG. 5B, after the second sacrificial layer 322 in and between the openings 314 and 316, and in the openings 318 and 320 is removed by a photolithographic etch process, the third sacrificial layer 324 is conformally formed on the first sacrificial layer 312 and the second sacrificial layer 322 and in the openings 314, 316, 318 and 320.

Please refer to FIG. 5C, which shows that the third sacrificial layer 324 in the openings 318 and 320 remains but the remainder of the third sacrificial layer 324 is removed by a photolithographic etch process. Next, a negative photoresist is spin-coated on the first sacrificial layer 312, the second sacrificial layer 322, and the third sacrificial layer 324, and in the openings 314, 316, 318 and 320, and fills the all openings to form a negative photoresist layer 326. The negative photoresist layer 326 is used for forming posts (not shown) between the first wall 310 and the second wall (not shown).

Please refer to FIG. 5D, which shows that a backside exposure process is performed on the negative photoresist layer 326 in the openings 314, 316, 318 and 320 in a direction of the transparent substrate 300. The sacrificial layer 110 must be made at least from opaque materials, typically metal materials, to meet the needs of the backside exposure process. Posts 328 remain in the openings 314, 316, 318 and 320 after removing the unexposed negative photoresist layer 326. Subsequently, the second wall 330 conformally covers the first sacrificial layer 312, the second sacrificial layer 322, the third sacrificial layer 324 and posts 328.

Afterward, the first sacrificial layer 312, the second sacrificial layer 322, and the third sacrificial layer 324 are removed by a release etch process to form the display units 302, 304, and 306 shown in FIG. 4, wherein the lengths d1, d2, and d3 of three display units 302, 304, and 306 are the thicknesses of the first sacrificial layer 312, the second sacrificial layer 322, and the third sacrificial layer 324, respectively. Therefore, different thicknesses of sacrificial layers must be used in different processes of the different display units, to achieve the objective for controlling reflection of different wavelengths of light.

There are at least three photolithographic etch processes required for manufacturing the matrix color planar display in the prior art, to define the lengths of the cavities of the display units 302, 304, and 306. In order to cooperate with the backside exposure for forming posts, metal materials must be used for making the sacrificial layer. The cost of the complicated manufacturing process is higher, and the yield cannot be increased due to the complicated manufacturing process.

Therefore, it is an important subject to provide a simple method of manufacturing an optical interference display unit structure, for manufacturing a color optical interference display with high resolution, high brightness, simple process and high yield.

SUMMARY OF THE INVENTION

It is therefore an objective of the present invention to provide a method for manufacturing an optical interference display unit structure, and the method is suitable for manufacturing a color optical interference display with resolution and high brightness.

It is another an objective of the present invention to provide a method for manufacturing an optical interference display unit structure, and the method is suitable for manufacturing a color optical interference display with a simple and easy manufacturing process and high yield.

It is still another objective of the present invention to provide a method for manufacturing an optical interference display unit structure, and the method is suitable for manufacturing a color optical interference display with posts.

In accordance with the foregoing objectives of the present invention, one preferred embodiment of the invention provides a method for manufacturing an optical interference display unit structure. The first wall and a sacrificial layer are formed in order on a transparent substrate, and then an opening is formed in the first wall and the sacrificial layer. The opening is suitable for forming posts therein. Next, a photoresist layer is spin-coated on the sacrificial layer and fills the opening. A photolithographic process patterns the photoresist layer to define a support with an arm. The support and the arm are used for a post, and to define the length of the arm. Due to the exposure of the photoresist layer with the help of a mask, the sacrificial layer no longer must be opaque materials such as metal and the like; common dielectric materials are also used for making the sacrificial layer.

The second wall is formed on the sacrificial layer and posts, and then baking is performed on the posts. The arm may generate displacement as the pivot of the support caused by stress action. An end of the arm adjacent to the support has less displacement, but another end of the arm has more displacement. The displacement of the arm may change the position of the second wall. Afterward, the sacrificial layer is removed by a release etch process to form a cavity, and the length D of the cavity may not be equal to the thickness of the sacrificial layer due to the displacement of the arm.

The arms with the ratios of various lengths to thicknesses have various amounts of stress, and displacements and directions generated by arms are various during baking. Therefore, the arms with the ratios of various lengths to thicknesses may be used for controlling the length of the cavity, instead of the various thicknesses of the sacrificial layers used in the various processes of the display units to control various wavelengths of light reflected in the prior art. There are many advantages in the above way. First of all, the cost drops drastically. The thickness of the cavity in the prior art is the thickness of the sacrificial layer, and the sacrificial layer needs to be removed at the end of the process. However, using an upward displacement of the arms in the present invention increases the length of the cavity, so that the length of the cavity is greater than the thickness of the sacrificial layer, even if the thickness of the sacrificial layer is substantially decreased while forming the same length of cavities. Therefore, the material used for manufacturing the sacrificial layer is substantially reduced. The second, the process time is shortened. The release etch process of the metal sacrificial layer in the prior art consumes lots of time, because the sacrificial layer is removed by an etching gas that must permeate the spaces between the posts. The present invention utilizes a mask for a front exposure, so the sacrificial layer can be transparent materials such as dielectric materials, instead of opaque materials such as metal and the like as in the prior art. Besides, the thickness used by the sacrificial layer can be substantially reduced, so the time required for the release etch process can be also drastically decreased. Third, the color optical interference display formed by using posts can substantially reduce complexity of the process. The difference in the ratios of lengths to thicknesses of arms of posts is used for changing the stress of the arms. After baking, various optical interference display units have various lengths of the cavities due to the displacement of arms, such that reflected light is changed with various wavelengths, such as red, green, and blue lights, so as to obtain various color lights.

In accordance with another an objective of the present invention, one preferred embodiment of the invention provides a method for manufacturing a matrix color planar display structure. Each matrix color planar display unit has three optical interference display units. The first wall and a sacrificial layer are formed in order on a transparent substrate, and then an opening is formed in the first wall and the sacrificial layer. The opening is suitable for forming posts therein. Next, a photoresist layer is spin-coated on the sacrificial layer and fills the opening. A photolithographic process patterns the photoresist layer to define a support with an arm. The support and the arm are used for a post, and to define the length of the arm. A single photolithographic process can accomplish the arms of three optical interference display units. Due to the exposure of the photoresist layer with the help of a mask, the sacrificial layer no longer must be an opaque material such as metal and the like; common dielectric materials are also used for making the sacrificial layer.

The second wall is formed on the sacrificial layer and posts, and then baking is performed on the posts. The arm may generate displacement as the pivot of the support caused by stress action. An end of the arm adjacent to the support has less displacement, but another end of the arm has more displacement. The displacement of the arm may change the position of the second wall. Afterward, the sacrificial layer are removed by a release etching process to form a cavity, and the length D of the cavity may not be equal to the thickness of the sacrificial layer due to the displacement of the arm.

The first wall is the first electrode, and the second wall is the second electrode. Each T-shaped arm of the optical interference display unit has variable length and stress. Therefore, after baking, each optical interference display unit has various cavity lengths due to the various displacements of arms, such that reflected light is changed with different wavelengths, such as red, green, and blue light. These in turn provide various color lights for a matrix color planar display structure.

In accordance with the color planar display consisting of an array of optical interference display units disclosed by the present invention, the advantages of a matrix color planar display according to the prior art are retained, including high resolution and high brightness, as well as the advantages of a multi-layered color planar display with a simple process and high yield in the prior art. It is understood that the present invention discloses an optical interference display unit which not only keeps all advantages of the prior optical interference color planar display such as high resolution, high brightness, simple process and high yield during forming arrays, but also increases the window during processing and raises the yield of the optical interference color planar display.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

In order to provide more information of the optical interference display unit structure, the first embodiment is provided herein to explain the optical interference display unit structure in this invention. In addition, the second embodiment is provided to give further description of the optical interference color planar display formed with an array of the optical interference display unit.

Embodiment 1

Figure 1:
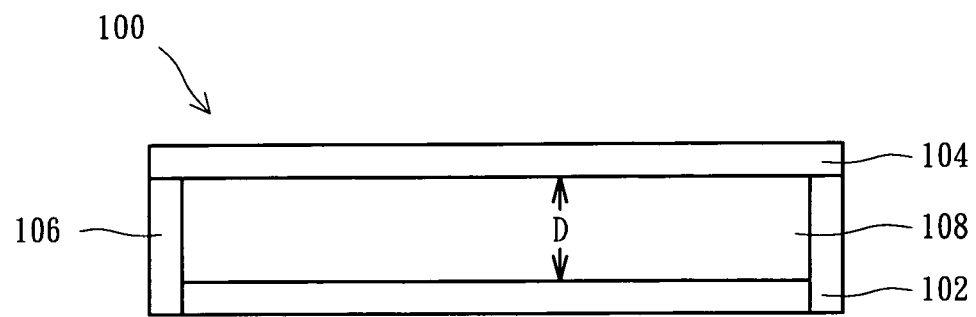
FIG. 1 depicts a cross-sectional view of a display unit in the prior art.
Figure 2:
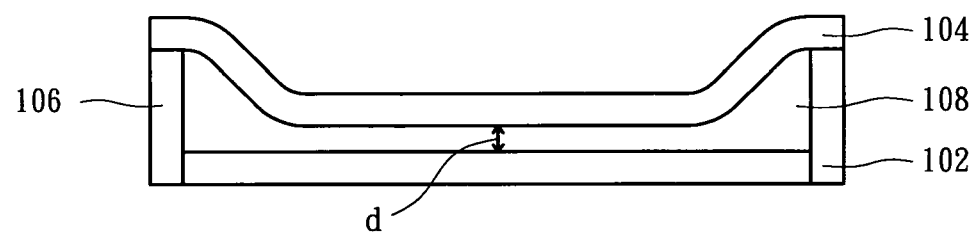
FIG. 2 depicts a cross-sectional view of a display unit in the prior art after applying a voltage.
Figure 3A:
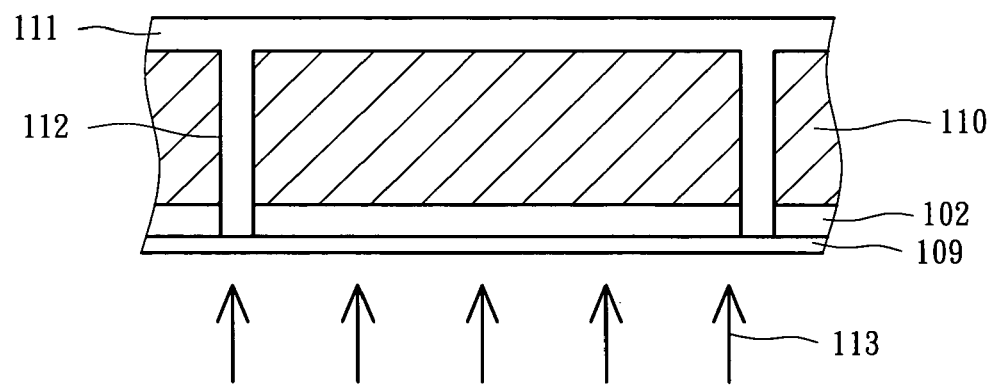
FIGS. 3A to 3C depict a method for manufacturing a display unit in the prior art.
Figure 3B:
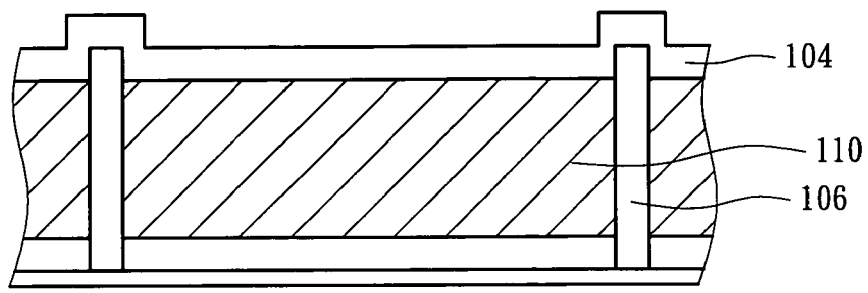
Figure 3C:
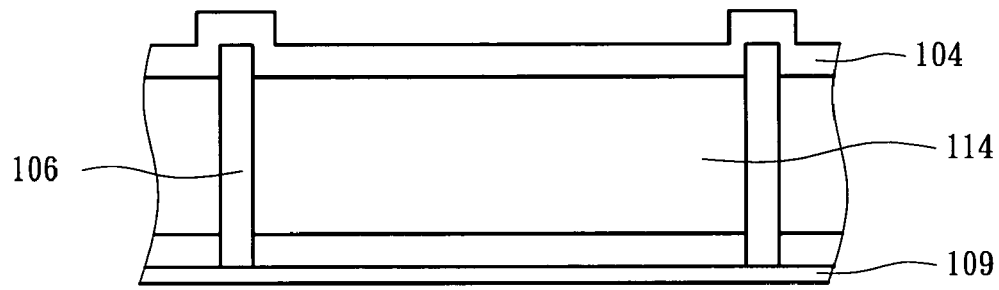
Figure 4:
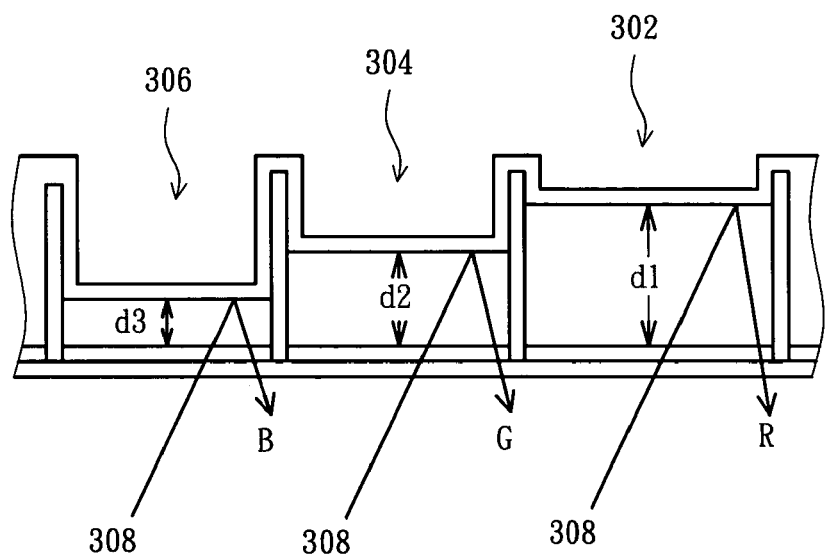
FIG. 4 depicts a cross-sectional view of a matrix color planar display in the prior art.
Figure 5A:
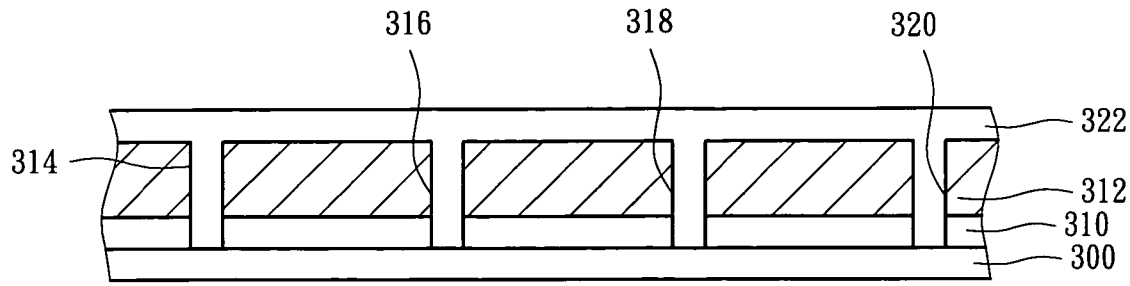
FIGS. 5A to 5D depict cross-sectional views of a method of manufacturing a matrix color planar display in the prior art.
Figure 5B:
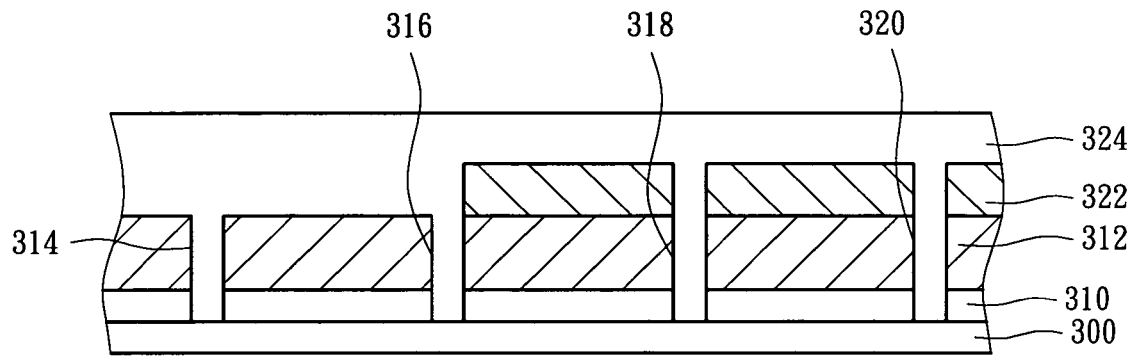
Figure 5C:
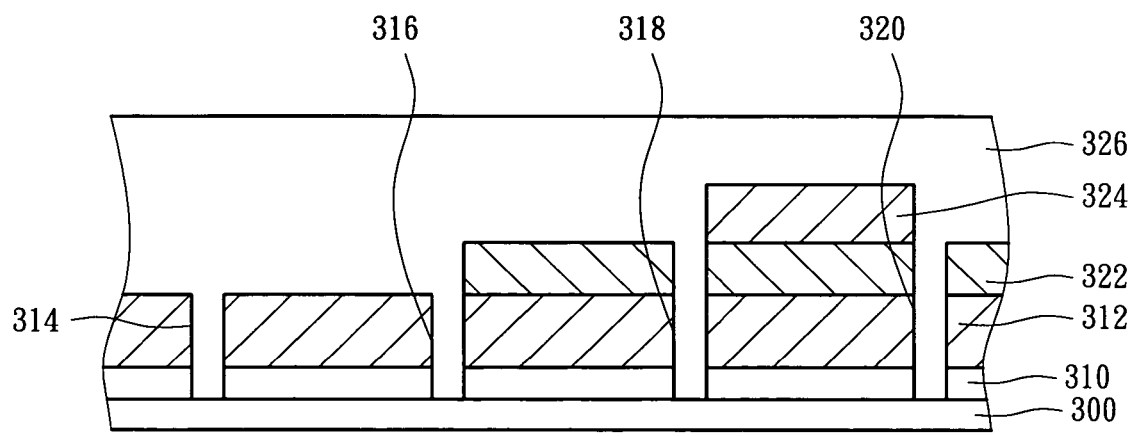
Figure 5D:
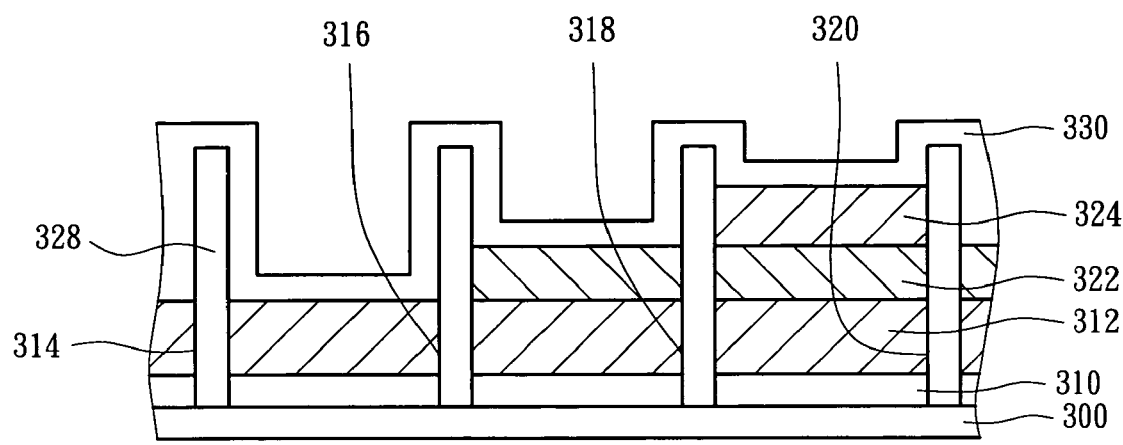
Figure 6A:
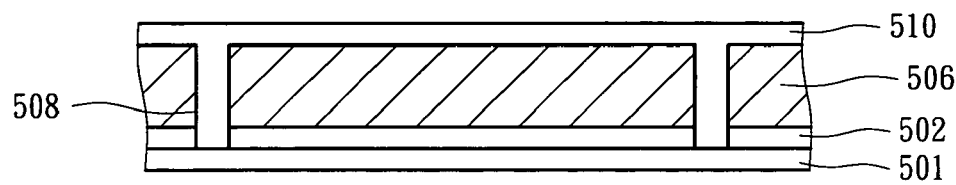
FIGS. 6A to 6C depict a method for manufacturing an optical interference display unit according to one preferred embodiment of this invention.
Figure 6B:
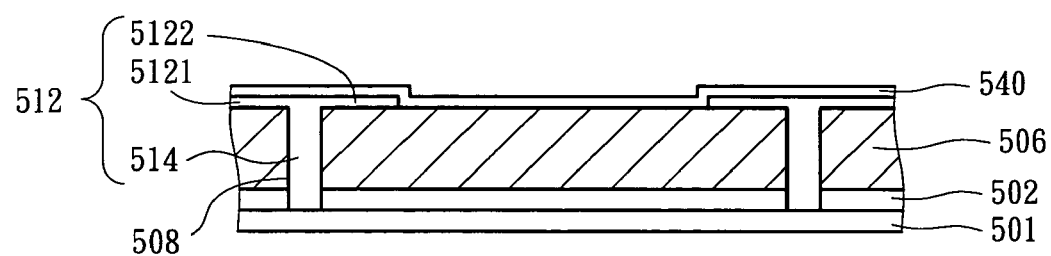
Figure 6C:
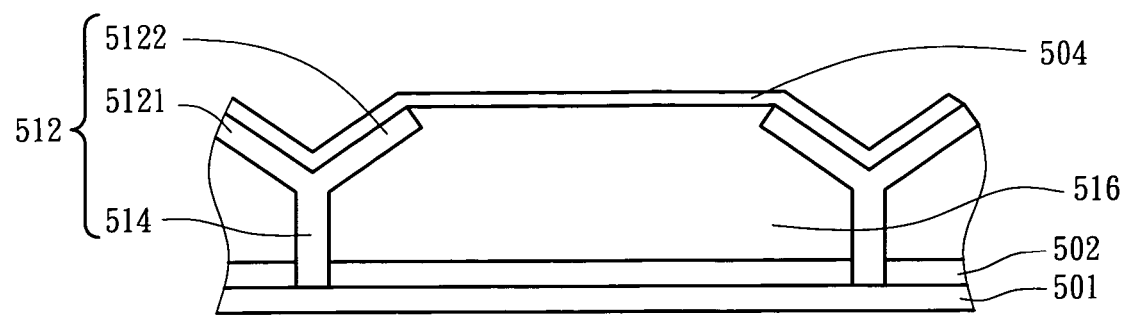

FIGS. 6A to 6C depict a method for manufacturing an optical interference display unit according to a preferred embodiment of the invention. Please referring to FIG. 6A first, a first electrode 502 and a sacrificial layer 506 are formed in order on a transparent substrate 501. The sacrificial layer 506 is made of transparent materials such as dielectric materials, or opaque materials such as metal materials. An opening 508 is formed in the first electrode 502 and the sacrificial layer 506 by a photolithographic etch process. The opening 508 is suitable for forming a post therein.

Next, a material layer 510 is formed in the sacrificial layer 506 and fills the opening 508. The material layer 510 is suitable for forming posts, and the material layer 510 generally uses photosensitive materials such as photoresists, or non-photosensitive polymer materials such as polyester, polyamide or the like. If non-photosensitive materials are used for forming the material layer 510, a photolithographic etch process is required to define posts in the material layer 510. In this embodiment, the photosensitive materials are used for forming the material layer 510, so merely a photolithographic etching process is required for patterning the material layer 510.

Please referring to figure 6B, the posts 512 are defined by patterning the material layer 510 during a photolithographic process. The post 512 has a support 514 disposed in the opening 508, and the post 512 has arms 5121 and 5122. The same photolithographic process also defines the lengths of arms 5121 and 5122. The thicknesses of the arms 5121 and 5122 are decided in the step of forming the material layer 510. A second electrode 540 is formed on the sacrificial layer 506 and the post 512.

Reference is next made to FIG. 6C. A thermal process is performed, such as baking. Arms 5121 and 5122 of the post 512 may generate displacement as the pivot of the support 514 caused by stress action. Ends of the arms 5121 and 5122 adjacent to the support 514 have less displacement, but other ends of the arms 5121 and 5122 have more displacement. The displacement of arms 5121 and 5122 may change the position of the second electrode 504. Thereafter, the sacrificial layer 506 is removed by a release etch process to form a cavity 516.

Figure 6D:
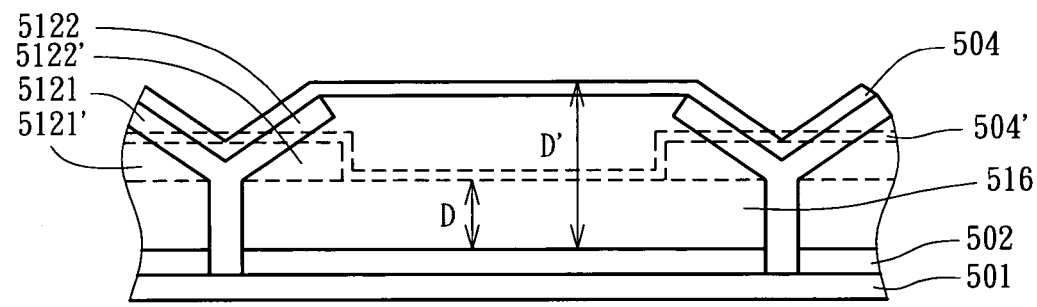
FIG. 6D depicts a cross-sectional view of an optical interference display unit according to one preferred embodiment of this invention.

The optical interference display unit made in FIGS. 6A to 6C is shown in FIG. 6D, which depicts a cross-sectional view of an optical interference display unit of one preferred embodiment of this invention. An optical interference display unit 500, which may be a color changeable pixel unit, at least comprises a first electrode 502 and a second electrode 504. The first electrode 502 and the second electrode 504 are approximately parallel to each other. The first electrode 502 and the second electrode 504 are selected from the group consisting of narrowband mirrors, broadband mirrors, non-metal mirrors or the combination thereof.

Posts 512 support the first electrode 502 and the second electrode 504. The arms 5121 and 5122 of the posts 512 are raised upwards. The length of the cavity is the thickness of the sacrificial layer in the optical interference display unit structure in the prior art. If the thickness of the sacrificial layer is D, the length of the cavity is D, too. In this embodiment, a cavity 516 is formed between the first electrode 502 and the second electrode 504 supported by posts 512. The posts 512 have the arms 5121 and 5122. The ratio of lengths to thicknesses of the arms 5121 and 5122 decide stress thereof, and a dotted line 5121' and a dotted line 5122' label the positions prior to performing a thermal process of the arms 5121 and 5122. After performing the thermal process, the arms 5121 and 5122 may generate displacement; therefore the position of the second electrode 504 changes from the original position labeled by the dotted line 504', and the length D' of the cavity 516 between the first electrode 502 and the second electrode 504 changes from the original length D. Since the length of the cavity 516 changes, the frequency of a reflected light changes following the length of the cavity 516. In general, when posts 512 are made from polyamide compounds, the ratio of lengths to thicknesses of the arms 5121 and 5122 is from 5 to 50, and the length D' of the cavity 516 is approximately 1.5 to 3 times the length D of the thickness of the sacrificial layer. Of course, the ratio of lengths to thicknesses of the arms 5121 and 5122 can be changed to make the length D' of the baked cavity 516 smaller than the thickness of the sacrificial layer.

In this invention, the materials suitable for forming posts 512 include positive photoresists, negative photoresists, and all kinds of polymers such as acrylic resins, epoxy resins and so on.

Embodiment 2

Figure 7A:
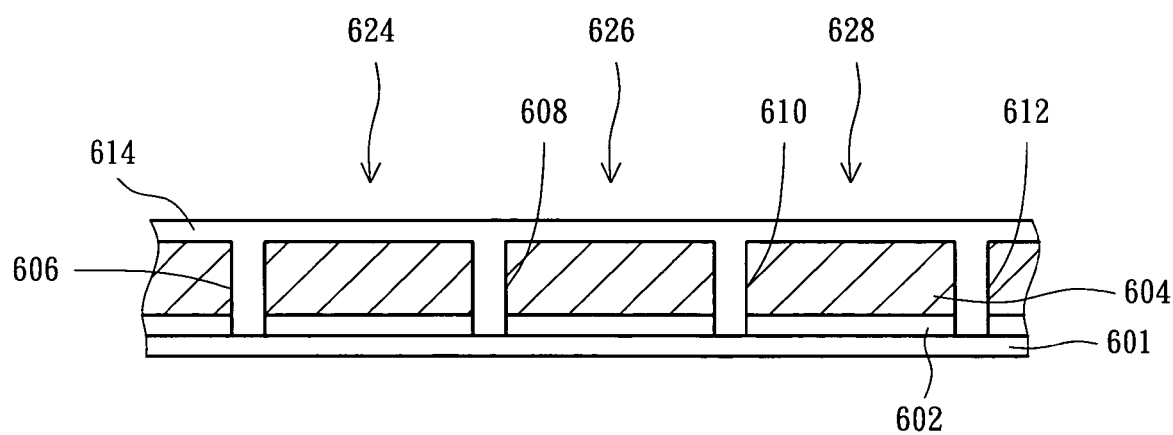
FIGS. 7A to 7D depict a method of manufacturing a matrix color planar display structure according to the second preferred embodiment of this invention.

FIGS. 7A to 7D depict a method for manufacturing a matrix color planar display structure according to the second preferred embodiment of this invention. Reference is made to FIG. 7A first, illustrating formation of the first electrode 602 and a sacrificial layer 604 in order on a transparent substrate 601. The sacrificial layer 604 can be made of transparent materials such as dielectric materials, or opaque materials such as metal materials. Openings 606, 608, 610, and 612 are formed in the first electrode 602 and the sacrificial layer 604 by a photolithographic etch process, and openings 606, 608, 610, and 612 are suitable for forming posts therein.

Next, a material layer 614 is formed on the sacrificial layer 604 and fills the openings 606, 608, 610, and 612. The optical interference display unit 624 is defined by openings 606 and 608, the optical interference display unit 626 is defined by openings 608 and 610, and the optical interference display unit 628 is defined by openings 610 and 612. The material layer 614 is suitable for forming posts, and is generally made from photosensitive materials such as polyester or non-photosensitive materials such as polyester, polyamide or the like. If a non-photosensitive material is used for forming the material layer 614, a photolithographic etching process is required to define posts on the material layer 614. In this embodiment, the photosensitive material is used for forming the material layer 614, so a single photolithographic etch process is sufficient for patterning the material layer 614.

Figure 7B:
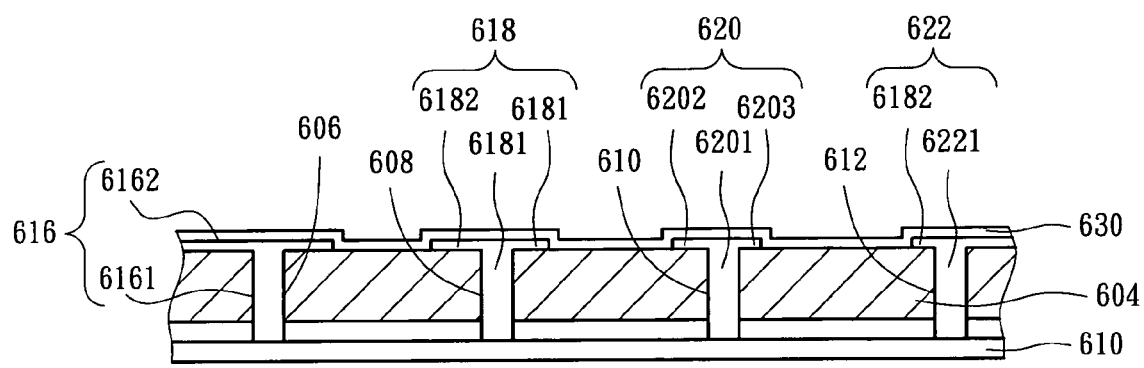

Please refer to FIG. 7B. A photolithographic process patterns the first material layer 614, so as to define posts 616, 618, 620, and 622. The posts 616, 618, 620, and 622 have supports 6161, 6181, 6201, and 6221 disposed in the openings 606, 608, 610, and 612, respectively. The posts 616, 618, 620, and 622 also have arms 6162, 6182, 6183, 6202, 6203, and 6222. The arms 6162, 6182, 6183, 6202, 6203, and 6222 are the same in length. A second electrode 630 is formed on the sacrificial layer 604, posts 616, 618, 620, and 622.

Figure 7C:
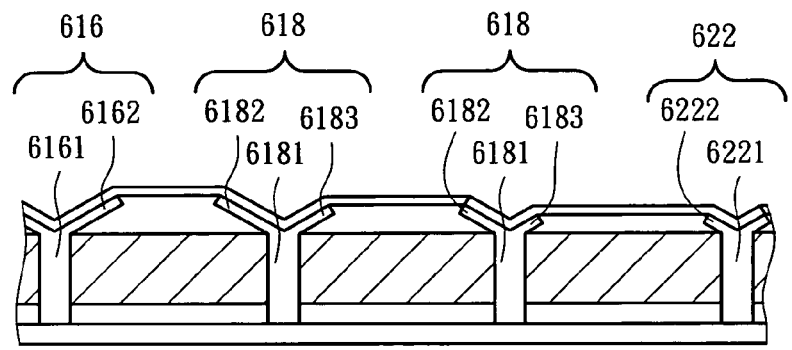

Please refer to FIG. 7C. A thermal process is performed, such as baking. The arms 6162, 6182, 6183, 6202, 6203, and 6222 of the posts 616, 618, 620, and 622 may generate displacement as the pivot of the supports 6161, 6181, 6201, and 6221 caused by stress action. There is less displacement at the ends of the arms 6162, 6182, 6183, 6202, 6203, and 6222 adjacent to the supports 6161, 6181, 6201, and 6221, but more displacement at the other ends of the arms 6162, 6182, 6183, 6202, 6203, and 6222. The displacements of the arms 6162 and 6182 are the same, the displacements of the arms 6183 and 6202 are the same, and the displacements of the arms 6203 and 6222 are the same. But there are various displacements among three above pairs of the arms. Therefore, there are various changes in the positions of the second electrode 630 caused by the arms 6162 and 6182, the arms 6183 and 6202, and the arms 6203 and 6222.

Figure 7D:
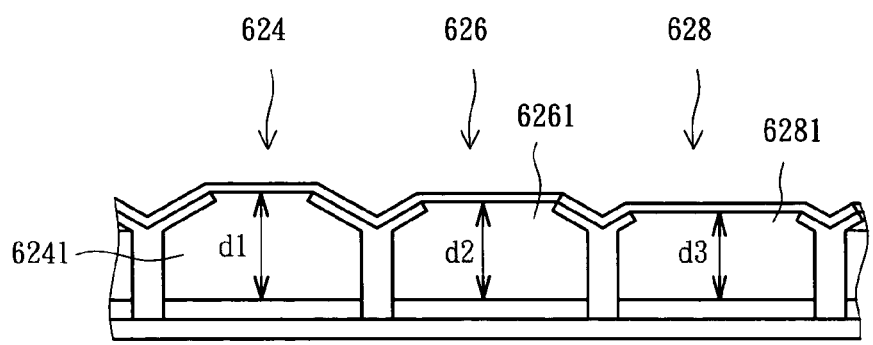

Thereafter, reference is made to FIG. 7D. The sacrificial layer 604 is removed by a release etch process to form the cavities 6241, 6261, and 6281 of the optical interference display units 624, 626, and 628. The cavities 6241, 6261, and 6281 have various lengths $d_1$, $d_2$, and $d_3$, respectively. When the optical interference display units 624, 626, and 628 are "open", as shown as the formula 1.1, the design of lengths $d_1$, $d_2$, and $d_3$ of the cavities 6241, 6261, and 6281 can generate the reflected light with different wavelengths, such as red (R), green (G), or blue (B) light.

The lengths $d_1$, $d_2$, and $d_3$ of the cavities 6241, 6261, and 6281 are not decided by the thickness of the sacrificial layer, but by the lengths of the arms 6162 and 6182, 6183 and 6202, 6203 and 6222, respectively. Therefore, the complicated photolithographic process of the prior art to define various lengths of the cavities forming various thicknesses of the sacrificial layers is unnecessary.

In accordance with the color planar display consisting of the array of optical interference display units disclosed by this embodiment, the advantages of a matrix color planar display in the prior art are retained, including high resolution and high brightness, as well as the advantages of the prior art multi-layered color planar display such as simple process and high yield. Compared with the matrix color planar display in the prior art, the embodiment discloses an optical interference display unit that does not require the complicated photolithographic process in the prior art to define various lengths of the cavities by forming various thicknesses of the sacrificial layers. The optical interference display unit thus has a simple process and high yield. Compared with the matrix color planar display in the prior art, the embodiment discloses an array of optical interference display units, in which all the optical interference display units that can generate reflected color light are located in the same plane. In other words, the incident light can reflect various color lights without passing through the multi-layered optical interference display unit; thus, the optical interference display unit has high resolution and high brightness. Furthermore, in the multi-layered optical interference display in the prior art, in order to make an incident light to pass through a former display unit and reach a latter display unit efficiently, and the result of light interference in the latter display unit (reflected light of green or blue light wavelength) to pass through a former display unit efficiently, the compositions and thicknesses of the first electrode and the second electrode of three types of display units are different. The manufacturing process is actually more complicated than expected. The process for the array of the optical interference display units disclosed by this invention is less difficult than the process in the prior art.

Although the present invention has been described in considerable detail with reference certain preferred embodiments thereof, other embodiments are possible. Therefore, their spirit and scope of the appended claims should no be limited to the description of the preferred embodiments container herein. In view of the foregoing, it is intended that the present invention cover modifications and variations of this invention provided they fall within the scope of the following claims and their equivalents.

What is claimed is:

1. A method for manufacturing an optical interference display unit disposed on a substrate, the method comprising:
    forming a first electrode on the substrate;
    forming a sacrificial layer on the first electrode;
    forming at least two openings in the sacrificial layer and the first electrode to define a position of the optical interference display unit;
    forming a support in each of the openings and at least one arm on the support, wherein the support and the at least one arm form a post;
    forming a second electrode on the sacrificial layer and the at least one arm;
    performing a thermal process to treat the post; and
    removing the sacrificial layer.

2. The method for manufacturing an optical interference display unit of claim 1, wherein the post comprises a photoresist.

3. The method for manufacturing an optical interference display unit of claim 1, wherein the post comprises photosensitive or non-photosensitive materials.

4. The method for manufacturing an optical interference display unit of claim 1, wherein the step of forming the post comprises:
    forming a photosensitive material layer to fill the openings and cover the sacrificial layer; and
    patterning the photosensitive material layer to form the support in each of the openings and at least one arm on the support, wherein the support and the at least one arm form the post.

5. The method for manufacturing an optical interference display unit of claim 4, wherein the step of patterning the photosensitive material layer includes a photolithographic process.

6. The method for manufacturing an optical interference display unit of claims 4 or 5, wherein the photosensitive material layer comprises a photoresist.

7. The method for manufacturing an optical interference display unit of claim 1, wherein the step of forming the support further comprises:
    forming a non-photosensitive material layer to fill the openings and cover the sacrificial layer; and
    patterning the non-photosensitive material layer to form the support in each of the openings and the at least one arm on the support by a photolithographic etching process, wherein the support and the at least one arm form the post.

8. The method for manufacturing an optical interference display unit of claim 1, wherein the thermal process comprises baking.

9. The method for manufacturing an optical interference display unit of claim 1, wherein the thermal process results in displacement of at least one arm due to stress.

10. The method for manufacturing an optical interference display unit of claim 1, wherein the first electrode comprises:
    the substrate;
    an absorption layer; and
    a dielectric layer.

11. The method for manufacturing an optical interference display unit of claim 9, wherein the substrate is a transparent material.

12. The method for manufacturing an optical interference display unit of claim 9, wherein the dielectric layer comprises silicon oxide, silicon nitride or metal oxide.

13. The method for manufacturing an optical interference display unit of claim 9, wherein the absorption layer comprises metal.

14. The method for manufacturing an optical interference display unit of claim 9, wherein the substrate comprises ITO glass or IZO glass.

15. The method for manufacturing an optical interference display unit of claim 1, wherein the first electrode and the second electrode are selected from a group consisting of narrowband mirrors, broadband mirrors, non-metal mirrors, metal mirrors and the combination thereof.

16. The method for manufacturing an optical interference display unit of claim 1, wherein the second electrode is a deformable electrode.

17. The method for manufacturing an optical interference display unit of claim 1, wherein the second electrode is a movable electrode.

18. A method for manufacturing an optical interference display unit of claim 1, wherein the second electrode at least comprises opaque materials or semi-transparent materials.

19. The method for manufacturing an optical interference display unit of claim 17, wherein the semi-transparent materials comprises ITO glass or IZO glass.

20. The method for manufacturing an optical interference display unit of claim 1, wherein the supports comprise photosensitive material.

* * * * *

UNITED STATES PATENT AND TRADEMARK OFFICE
CERTIFICATE OF CORRECTION

PATENT NO. : 7,198,973 B2
APPLICATION NO. : 10/705824
DATED : April 3, 2007
INVENTOR(S) : Wen-Jian Lin and Hsiung-Kuang Tsai It is certified that error appears in the above-identified patent and that said Letters Patent is hereby corrected as shown below:

Title Page; item(s) 75, 57 and 56;

At First Page Column 1 (Inventors), Line 2, after "Taipai" please insert -- City --.

At First Page Column 2 (Abstract), Line 11, delete "The" and please insert -- the --, therefor.

At Page 3 Column 2 (U.S. Patent Documents), Line 57, below "2002/0137072" please insert -- 2002/0138213 07/2003 Jin et al. --.

At Page 4 Column 2 (Other Publications), Line 10, delete "array"" and please insert -- Filter Array," --, therefor.

At Page 4 Column 2 (Other Publications), Line 17, delete "Quanum" and please insert -- Quantum --, therefor.

At Page 5 Column 1 (Other Publications), Line 13, delete "2686," and please insert -- 26-86, --, therefor.

At Page 5 Column 1 (Other Publications), Line 17, delete "Reconfiguraable" and please insert -- Reconfigurable --, therefor.

At Page 5, Column 1 (Other Publications), Line 32, delete "Seach" and please insert -- Search --, therefor.

At Column 10, Line 30, in Claim 11, delete "9" and please insert -- 10 --, therefor.

At Column 10, Line 33, in Claim 12, delete "9" and please insert -- 10 --, therefor.

At Column 10, Line 36 (Approximately), in Claim 13, delete "9" and please insert -- 10 --, therefor.

At Column 10, Line 39 (Approximately), in Claim 14, delete "9" and please insert -- 10 --, therefor.

At Column 10, Line 53 (Approximately), in Claim 18, delete "A" and please insert -- The --, therefor.

UNITED STATES PATENT AND TRADEMARK OFFICE
CERTIFICATE OF CORRECTION

PATENT NO. : 7,198,973 B2
APPLICATION NO. : 10/705824
DATED : April 3, 2007
INVENTOR(S) : Wen-Jian Lin and Hsiung-Kuang Tsai It is certified that error appears in the above-identified patent and that said Letters Patent is hereby corrected as shown below:

At Column 10, Line 57 (Approximately), in Claim 19, delete "17" and please insert -- 18 --, therefor.

At Column 10, Line 61, in Claim 20, after "comprise" please insert -- a --.

Signed and Sealed this

Seventh Day of April, 2009

JOHN DOLL
*Acting Director of the United States Patent and Trademark Office*